United States Patent
Parker et al.

(10) Patent No.: US 12,420,641 B2
(45) Date of Patent: Sep. 23, 2025

(54) LEAK DETECTION SYSTEM FOR VEHICLE BATTERY ENVIRONMENT AND RELATED METHODOLOGY

(71) Applicant: Redline Detection, LLC, Orange, CA (US)

(72) Inventors: Melissa Alex Parker, Orange, CA (US); Eric A. Bingle, Orange, CA (US)

(73) Assignee: REDLINE DETECTION, LLC, Orange, CA (US)

( * ) Notice: Subject to any disclaimer, the term of this patent is extended or adjusted under 35 U.S.C. 154(b) by 263 days.

(21) Appl. No.: 17/843,388

(22) Filed: Jun. 17, 2022

(65) Prior Publication Data

US 2022/0410717 A1 Dec. 29, 2022

Related U.S. Application Data (60) Provisional application No. 63/330,022, filed on Apr. 12, 2022, provisional application No. 63/215,178, filed on Jun. 25, 2021.

(51) Int. Cl.
*B60L 58/10* (2019.01)
*B60L 3/00* (2019.01)
(Continued)

(52) U.S. Cl.
CPC ............ *B60L 3/0046* (2013.01); *B60L 58/10* (2019.02); *G01M 3/3263* (2013.01); *G01R 31/385* (2019.01); *B60L 2240/54* (2013.01)

(58) Field of Classification Search
CPC .................................................. H01M 10/50
See application file for complete search history.

(56) References Cited

U.S. PATENT DOCUMENTS

| 1,506,418 A | 8/1924 | Evensta et al. |
| 1,510,212 A | 9/1924 | Bois |
| (Continued) | | |

FOREIGN PATENT DOCUMENTS

| DE | 4411928 | 1/1995 |
| GB | 640266 | 7/1950 |
| (Continued) | | |

OTHER PUBLICATIONS

Intake Pressure Testers for the Turbocharged Mitsubishi 3000GT/Dodge Stealth; http://www.stealth316.com/2-pressuretester.htm, Retrieved via Internet Archive. Dated Feb. 16, 2007.

(Continued)

*Primary Examiner* — Jamel E Williams
(74) *Attorney, Agent, or Firm* — STETINA GARRED BRUCKER & NEWBOLES (57) ABSTRACT

A battery case leak testing device includes a housing having a testing port. A pump is in fluid communication with the testing port and is configured to generate a prescribed pressure at the testing port. A pressure sensor is in fluid communication with the testing port to measure fluid pressure at the testing port. A controller is in operative communication with the pump and the pressure sensor, and is configured to facilitate operation of the pump in a first mode and a second mode. In the first mode, the pump operates to generate a first prescribed pressure at the testing port. In the second mode, the pump operates to generate a second prescribed pressure at the testing port. The controller transitions the pump from the first mode to the second mode when the pressure sensor measures a prescribed pressure characteristic when the pump is operating in the first mode.

14 Claims, 10 Drawing Sheets

(51) Int. Cl.
*G01M 3/32* (2006.01)
*G01R 31/385* (2019.01)

(56) References Cited

U.S. PATENT DOCUMENTS

| | | | |
|---|---|---|---|
| 1,710,439 A | 4/1929 | Taylor | |
| 2,192,155 A | 2/1940 | Schuldt | |
| 2,273,984 A | 2/1942 | Osborn | |
| 2,299,116 A | 10/1942 | Svirsky | |
| 2,753,876 A | 7/1956 | Kurt | |
| 2,764,243 A | 9/1956 | Page | |
| 3,024,200 A | 3/1962 | Smith | |
| 3,075,535 A | 1/1963 | Lasting | |
| 3,129,726 A | 4/1964 | Moore | |
| 3,234,357 A | 2/1966 | Seuthe | |
| 3,431,945 A | 3/1969 | Robillard | |
| 3,431,946 A | 3/1969 | Sawyer | |
| 3,583,239 A | 6/1971 | Paine | |
| 3,822,585 A * | 7/1974 | Toback | G01M 3/3236 73/49.2 |
| 3,837,214 A | 9/1974 | Guest | |
| 3,870,085 A | 3/1975 | Schneider | |
| 4,352,515 A | 10/1982 | Schumacher | |
| 4,354,515 A | 10/1982 | Sutherland | |
| 4,373,381 A | 2/1983 | Kulp et al. | |
| 4,373,767 A | 2/1983 | Cairns | |
| 4,460,019 A | 7/1984 | Condon | |
| 4,524,607 A | 6/1985 | Pelletier et al. | |
| 4,550,751 A | 11/1985 | Shimamura | |
| 4,608,858 A | 9/1986 | McKinnon | |
| 4,750,525 A | 6/1988 | Vaughn | |
| 4,764,660 A | 8/1988 | Swiatosz | |
| 4,818,843 A | 4/1989 | Swiatosz | |
| 4,887,931 A | 12/1989 | Frisby et al. | |
| 4,905,931 A | 3/1990 | Covey | |
| 5,022,435 A | 6/1991 | Jaw-Shiunn | |
| 5,107,698 A | 4/1992 | Gilliam | |
| 5,328,152 A | 7/1994 | Castle | |
| 5,353,842 A | 10/1994 | Lundman | |
| 5,390,738 A | 2/1995 | Eslinger et al. | |
| 5,425,266 A | 6/1995 | Fournier | |
| 5,501,115 A | 3/1996 | Kamiyama et al. | |
| 5,647,054 A | 7/1997 | Jones | |
| 5,735,955 A | 4/1998 | Monaghan et al. | |
| 5,771,937 A | 6/1998 | Collins | |
| 5,859,363 A | 1/1999 | Gouge | |
| 5,922,944 A | 7/1999 | Pieroni et al. | |
| 6,018,615 A | 1/2000 | Loblick | |
| 6,116,286 A | 9/2000 | Hooper | |
| 6,131,441 A | 10/2000 | Berube et al. | |
| 6,142,009 A | 11/2000 | Loblick | |
| 6,175,987 B1 | 1/2001 | Harvey | |
| 6,267,001 B1 | 7/2001 | Duncan | |
| 6,314,795 B1 | 11/2001 | Ingham | |
| 6,336,482 B1 | 1/2002 | Cunkle et al. | |
| 6,348,869 B1 | 2/2002 | Ashworth | |
| 6,351,985 B1 | 3/2002 | Bedwell et al. | |
| 6,361,752 B1 | 3/2002 | Demarest et al. | |
| 6,389,613 B1 | 5/2002 | Comas | |
| 6,392,227 B1 | 5/2002 | Banyard et al. | |
| 6,439,031 B1 | 8/2002 | Pieroni et al. | |
| 6,481,465 B1 | 11/2002 | Warmerdam | |
| 6,502,603 B2 | 1/2003 | Lane, Jr. | |
| 6,526,808 B1 | 3/2003 | Pieroni et al. | |
| 6,651,486 B1 | 11/2003 | Johnson et al. | |
| RE38,686 E | 1/2005 | Loblick | |
| 6,899,138 B2 | 5/2005 | Lundman | |
| 6,907,771 B2 | 6/2005 | Finlay et al. | |
| 7,013,926 B1 | 3/2006 | Storey | |
| 7,305,176 B1 | 12/2007 | Pieroni | |
| 7,597,118 B1 | 10/2009 | Peterson et al. | |
| 8,256,467 B1 | 9/2012 | Larson et al. | |
| 2001/0035046 A1 | 11/2001 | Williams | |
| 2002/0152801 A1 | 10/2002 | Burke et al. | |
| 2003/0047881 A1 | 3/2003 | Worm et al. | |
| 2007/0079649 A1 | 4/2007 | Nauseda et al. | |
| 2007/0297774 A1 | 12/2007 | Pieroni | |
| 2009/0277800 A1 | 11/2009 | Grimes | |
| 2009/0315326 A1 | 12/2009 | Pieroni | |
| 2010/0095746 A1 | 4/2010 | Lund | |
| 2012/0201522 A1 | 8/2012 | Stauffer | |
| 2013/0247651 A1 | 9/2013 | Grange | |
| 2013/0260192 A1* | 10/2013 | LePort | H01M 10/42 429/62 |
| 2013/0319540 A1 | 12/2013 | Hegner | |
| 2014/0083168 A1 | 3/2014 | Parker et al. | |

FOREIGN PATENT DOCUMENTS

| | | |
|---|---|---|
| GB | 1039729 | 8/1966 |
| GB | 1240867 | 7/1971 |
| JP | S56110032 | 9/1981 |
| JP | 59126223 | 7/1984 |
| JP | 59138935 | 8/1984 |
| JP | 2003004581 | 1/2003 |
| KR | 2020083692 A * 7/2020 | .......... G01M 3/3263 |
| KR | 1020200083692 | 7/2020 |
| WO | 2015171821 | 11/2015 |

OTHER PUBLICATIONS

DSM Boost Leaks/Turbo intake Pressure Tester; http://www.mirage-performance.com/EclipseGSX/BoostLeaks/index.html, Retrieved via Internet Archive. Dated Feb. 8, 2007.
Copenheaver, Blaine R.; Patent Cooperation Treaty International Search Report; PCT/US2017/063055; Feb. 5, 2018; 11 pages.
Matos, Taina.; Patent Cooperation Treaty International Search Report; PCT/US2022/034179; Oct. 4, 2022; 10 pages.
Patent Cooperation Treaty International Search Report; PCT/US2013060732; Feb. 11, 2014; 5 pages.
European Patent Office Extended Search Report; 13841836.1-1557/2901066; 3 pages.

* cited by examiner

Battery Case Test Report

ACME Automotive
1234 1st Street
Los Angeles, CA. 99999
(555) 555-5555

BATTERY CASE SEALING INTEGRITY TEST INFORMATION:

| | |
|---|---|
| Date of Test: | 2021-02-10 |
| Time of Test: | 08:44 |
| Vehicle ID: | 1234567890ABCDEFG |
| Battery Case Volume: | 21L |
| Repair Order Number: | 12345678 |
| Result: | Pass |

BATTERY CASE LEAK DETECTOR INFORMATION:

| | |
|---|---|
| Hardware Version: | HW Version 1.0.0.0 |
| Software Version: | SW Version 1.0.1.0 |
| Firmware Version: | FW Version 1.0.2.2 |

FIG. 10

LEAK DETECTION SYSTEM FOR VEHICLE BATTERY ENVIRONMENT AND RELATED METHODOLOGY

CROSS-REFERENCE TO RELATED APPLICATIONS

This application claims priority to U.S. Provisional Application No. 63/330,022 filed Apr. 12, 2022, and claims priority to U.S. Provisional Application No. 63/215,178 filed Jun. 25, 2021, the contents of which are expressly incorporated herein by reference.

STATEMENT RE: FEDERALLY SPONSORED RESEARCH/DEVELOPMENT

Not Applicable

BACKGROUND

1. Technical Field

The present disclosure relates generally to a leak detecting device and related methodology, and more specifically, to a leak detecting device for detecting a leak in a battery case, or related structure or system, for an electric vehicle battery.

2. Description of the Related Art

Emerging new vehicle propulsion technology may be driven by the inclusion of high-voltage components across many vehicle classifications. A significant development in new vehicle technology is the battery electric vehicle (BEV), which relies on a high-voltage battery pack for stored energy to power an electric motor. The battery packs are typically comprised of many small-voltage modules, which collectively provide high-voltage, and are safely organized in a typically large and hefty battery case. In most instances, the battery case must maintain sealing integrity to achieve optimum performance.

After a BEV has been operated for some time, the driver may notice a change in the state of health of the battery, oftentimes associated with a reduction in the vehicle's range. The driver may take the vehicle to a dealership to seek diagnosis and treatment to improve the battery health.

Given the importance associated with maintaining sealing integrity in the battery cases, there is a need in the art for a device and related methodology, which allows for testing the sealing integrity of the battery case. Various aspects of the present disclosure address this particular need, as will be discussed in more detail below.

BRIEF SUMMARY

In accordance with one embodiment of the present disclosure, there is provided a method of testing a battery case of an electric vehicle battery, with the battery case having a battery case service port. The method includes fluidly connecting a leak detector to the service port on the battery case, with the leak detector having a pump and a pressure sensor. Operation of the leak detector is configured based on a volume of the battery case. A pre-test is conducted by operating the pump by applying a first pressure to the volume of the battery case to determine whether the applied pressure results in a change in pressure in the volume of the battery case based on a sensed pressure from the pressure sensor. When a change in pressure is detected, the method includes conducting a main test by operating the pump to apply a second pressure to the volume of the battery case. The method further includes sensing a pressure within the volume of the battery case after applying the second pressure to the volume of the battery case.

The step of applying a second pressure may include applying negative pressure to the volume of the battery case. The step of applying a second pressure may include applying positive pressure to the volume of the battery case.

The method may additionally include displaying information associated with sensed pressure.

The method may further comprise generating a report associated with the sensed pressure.

The method may also include the step of determining the volume of the battery case based on received vehicle information.

According to another embodiment, there is provided a battery case leak testing device comprising a housing having a testing port. A pump is in fluid communication with the testing port, with the pump being configured to generate a prescribed pressure at the testing port. A pressure sensor is in fluid communication with the testing port to measure fluid pressure at the testing port. A controller is coupled to the housing and is in operative communication with the pump and the pressure sensor, with the controller being configured to facilitate operation of the pump in a first mode and a second mode. In the first mode, the pump operates to generate a first prescribed pressure at the testing port. In the second mode, the pump operates to generate a second prescribed pressure at the testing port. The controller transitions the pump from the first mode to the second mode when the pressure sensor measures a prescribed pressure characteristic when the pump is operating in the first mode.

When in the second mode, the pressure sensor may be configured to measure pressure at the testing port over a prescribed period of time, and the controller may be configured to generate a pass signal when the measured pressure conforms to a prescribed pressure profile. The prescribed pressure profile may be vehicle specific and may be determinable by the processor based on vehicle information associated with the vehicle under test.

The device may include a hose fluidly connectable to the testing port. The device may further comprising an adapter coupled to the hose and configured to be connectable to the service port.

The device may additionally comprise a fluid pathway between the pump and the testing port. A valve may be in fluid communication with the fluid pathway and capable of transitioning between an open position and a closed position. In the closed position, the valve may prevent fluid communication between the pump and the valve.

The pump may be configured to generate a negative pressure at the testing port. Alternatively, the pump may be configured to generate a positive pressure at the testing port.

According to yet another embodiment, the battery case leak testing device includes a housing having a positive pressure testing port and a negative pressure testing port. A negative pressure pump is in operative communication with the controller and in fluid communication with the negative pressure testing port, with the negative pressure pump being configured to generate a prescribed negative pressure at the negative pressure testing port. A positive pressure pump is in operative communication with the controller and in fluid communication with the positive pressure testing port, with the positive pressure pump being configured to generate a prescribed positive pressure at the positive pressure testing port. A negative pressure sensor is in fluid communication with the negative pressure testing port to measure fluid pressure at the negative pressure testing port. A positive pressure sensor is in fluid communication with the positive pressure testing port to measure fluid pressure at the positive pressure testing port. A controller is coupled to the housing and is in operative communication with the negative pressure pump, the positive pressure pump, the negative pressure sensor and the positive pressure sensor. The controller is configured to facilitate operation of the device in a negative test mode and a positive test mode. In the negative test mode, the negative pressure pump is actuated to generate a prescribed negative pressure at the negative pressure testing port. In the positive test mode, the positive pressure pump is actuated to generate a prescribed positive pressure at the positive pressure testing port. The controller is configured to determine operation in one of the negative test mode and the positive test mode based on information received associated with a battery case under test.

When in the negative test mode, the negative pressure sensor may be configured to measure pressure at the negative testing port over a prescribed period of time, and the controller may be configured to generate a pass signal when the measured pressure conforms to a prescribed pressure profile.

The prescribed pressure profile may be vehicle specific and may be determinable by the processor based on vehicle information associated with the vehicle under test.

When in the positive test mode, the positive pressure sensor may be configured to measure pressure at the positive testing port over a prescribed period of time, and the controller may be configured to generate a pass signal when the measured pressure conforms to a prescribed pressure profile.

The device may include a hose fluidly connectable to one of the negative testing port and the positive testing port. The may further comprise an adapter coupled to the hose and configured to be connectable to the service port.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which.

Common reference numerals are used throughout the drawings and the detailed description to indicate the same elements.

DETAILED DESCRIPTION

The detailed description set forth below in connection with the appended drawings is intended as a description of certain embodiments of an electric vehicle battery case leak detector and is not intended to represent the only forms that may be developed or utilized. The description sets forth the various structure and/or functions in connection with the illustrated embodiments, but it is to be understood, however, that the same or equivalent structure and/or functions may be accomplished by different embodiments that are also intended to be encompassed within the scope of the present disclosure. It is further understood that the use of relational terms such as first and second, and the like are used solely to distinguish one entity from another without necessarily requiring or implying any actual such relationship or order between such entities.

Referring now to the drawings, wherein the showings are for purposes of illustrating preferred embodiments of the present disclosure, and are not for purposes of limiting the same, various aspects of the present disclosure relate to a leak detector 10 configured for detecting a leak in a battery case 12, or associated environment (e.g., battery cooling system) on an electric vehicle. The leak detector 10 is capable of being fluidly connectable to a service port 14 on the battery case 12 and applying a prescribed pressure to an enclosure within the battery case 12 for purposes of testing the integrity of the battery case 12. As the pressure is applied to the battery case 12, any pressure decay may be monitored by the leak detector 10 to identify the possible presence of the leak in the battery case 12. In this regard, a rate of pressure decay which exceeds a prescribed threshold may be indicative of a leak, while a rate of pressure decay that falls below the prescribed threshold may be indicative of no leak. The ability to test the integrity of the battery case 12 may allow the batteries to operate at an efficient level as well as to mitigate any performance issues that may arise from a leaky battery case 12.

The accelerated adoption of battery powered electric vehicles by consumers and commercial entities, supported by development of charging infrastructure and environmental legislation, has rapidly increased the speed of manufacturing of new electric vehicles by both startup electric vehicle manufacturers and traditional OEMs. As these new electric passenger and commercial vehicles are sped to market, it has brought to focus the urgent need for procedures and tools to service and repair such vehicles to ensure reliability and consumer safety.

In particular, it is well documented that catastrophic thermal events in battery systems can be caused by water intrusion or dust and debris intrusion into the pack or battery enclosure. Leaks of this type can be attributed to faulty sealing procedures during assembly; lapses in curing or storage or sealing or sealed materials and components; flex and torsion during transportation of battery packs or installation into vehicles; normal resealing of battery packs and coolant systems after routine lid off battery repair and maintenance; reinstallation of battery packs and coolant systems when returned to a vehicle after any maintenance or repair; fatigue and wear in normal vehicle use over varied road conditions; collision of the vehicle on any surface that results in force into the battery containment unit; collision or body repair that stresses the frame and battery mounting points; incorrect lifting or towing of the vehicle which results in stress or torsion of the frame and battery; and torsion of the vehicle from normal to-be-expected forces such as the vehicle driving over a curb or striking a pothole during normal use.

Electric and hybrid vehicle battery packs may be expected to meet the International Electrotechnical Commission's IP67 standard, European EN 60529, and subsequent requirements that may require components be capable of being immersed in one meter of water for 30 minutes with no "harmful quantity" of water ingress. The testing process, however, is costly and time consuming for auto manufacturers. The leak detector 10 described herein may provide a pre-test to ensure that battery packs are prepared to be submerged, and a post test for pinpointing any faults. The application of this technology at the engineering, testing, and end of line points will speed the production of vehicles while ensuring maximum safety standards.

At the workshop or garage level, in the past, leaks of this kind in a traditionally aspirated propulsion system would be detected by pressuring the system and spraying with soapy water to see bubbles; using audible clues, i.e., listening for leaks; or using a visible vapor diagnostic leak detector, often called a smoke machine, to identify leaks. In battery electric vehicles, however, the introduction of a foreign material, soapy water or the smoke created by the vaporization of mineral oil, is counter to the well documented requirement to keep the battery enclosure free of contaminants and therefore such prior art procedures are ineffective and ill-advised for this application. The leak detector 10 may achieve the goal of effective leak detection and pinpointing of all leaks in the battery system without introducing contaminants that could cause further issues. The leak detector 10 may further be uniquely designed to create a continuity of testing from engineering design, to end of line testing, through the use in workshop settings to ensure integrity of testing and safety for the life of the vehicle.

Figure 1:
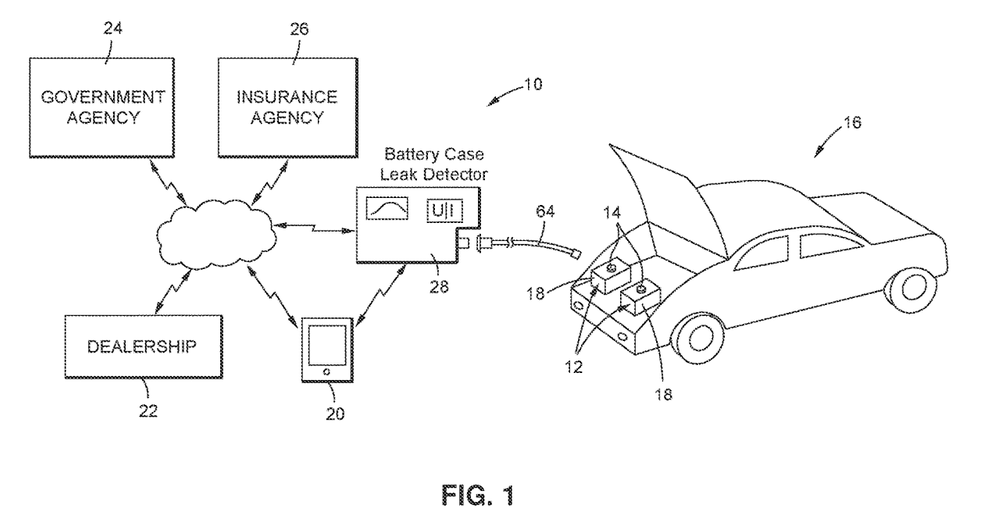
FIG. 1 is a schematic view of a battery case leak detector used for testing a battery case of an electric vehicle.

Referring now specifically to FIG. 1, there is depicted a schematic view of the leak detector 10 for testing the fluid integrity of a plurality of battery cases 12 located in a vehicle 16. As used herein, the term battery case 12 refers broadly to a structure that houses one or more batteries. The battery case 12 may include a main body 18 and the service port 14 connected to the main body 18 and in fluid communication with an interior volume or cavity of the main body 18. The size, shape, and configuration of the battery case 12 may vary among batteries or vehicle manufacturers. It is contemplated that the interior volume (e.g., testing volume) of the battery case 12 may be less than or equal to 200 liters, although many battery cases 12 may be associated with an interior volume between 9-160 liters. Depending on the configuration of the battery case 12, it is contemplated that the leak detector 10 may be fluidly connected to the battery case 12 while the battery case 12 is on the vehicle 16, or alternatively, when the battery case 12 is removed from the vehicle 16.

As shown in FIG. 1, the leak detector 10 may be in operative communication with one or more remote resources, facilities, agencies, etc., such as a user's electronic device 20, a vehicle dealership 22, a government agency 24, an insurance agency 26, etc., to facilitate communication of testing data or testing criteria, as may be beneficial to facilitate one or more vehicle-related services, as will be described in more detail below.

Figure 2:
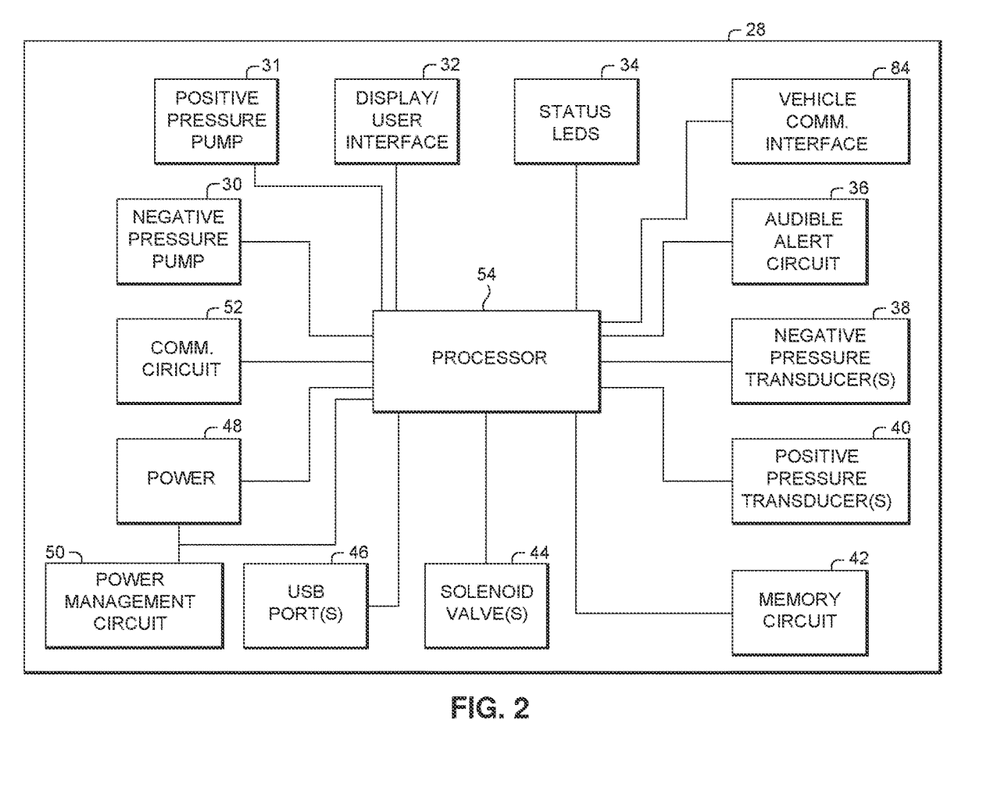
FIG. 2 is a schematic view of electrical components included in one embodiment of the leak detector.

The leak detector 10 may include a housing 28 that encloses several components stored within the leak detector 10. Referring now specifically to FIG. 2, there is depicted a schematic view of one embodiment of the leak detector 10, which includes a negative pressure pump 30, a positive pressure pump 31, a display/user interface 32, status LEDs 34, an audible alert circuit 36, negative pressure transducer(s) 38, positive pressure transducer(s) 40, a memory circuit 42, a solenoid valve 44, USB port(s) 46, a power supply 48, a power management circuit 50, and a communications circuit 52, all of which are in electrical communication with a processor 54. In this regard, the processor 54 may receive data signals from various components (e.g., display/user interface 32, pressure transducers 40, 42, etc.) and generate operational command signals for various components (e.g., the pumps 30, 31, status LEDs 34, solenoid valve(s) 44, etc.) to facilitate operation of the leak detector 10.

The housing 28 may enclose many of the electrical components of the leak detector 28. The housing 28 may be formed of metal, plastic, rubber, or other materials known in the art. In one exemplary embodiment the housing 28 may be no greater than 20 inches wide, 18 inches tall, and 10 inches deep. However, other sizes, shapes, and configurations may be used without departing from the spirit and scope of the present disclosure. The housing 28 may be sized and shaped to allow for transport of the leak detector 10 by a single individual. In this regard, the housing 28 may include a handle and/or wheels connected thereto to facilitate transport thereof.

The leak detector 10 may include both one or more negative pressure pump(s) 30 and/or one or more positive pressure pump(s) 31 to generate negative or positive pressures, as may be needed when conducting different leak detection tests. In one particular embodiment, the negative pressure pump 30 may be capable of drawing a range of negative pressures, including a high vacuum (negative pressure) on a sealed enclosure (e.g., a battery case 12) that is of a volume of approximately 200 liters. The negative pressure pump 30 may be powered by 12 VDC and may be capable of generating a maximum high vacuum (negative pressure) signal of 0.10132 barA (−0.91192 barG) at a minimum flow rate of 7 CFM (200 L/m).

With regard to the positive pressure pump 31, according to one implementation, the positive pressure pump 31 may be configured to apply a low positive pressure, such as a pressure less than 75 PSIG. The low positive pressure pump 31 may be capable of generating a maximum positive pressure signal of 4.5 barA (3.5 barG) at a minimum flow rate of 7 CFM (200 L/m).

The negative and positive pressure pumps 30, 31 may both be located in the housing 28 and may be associated with respective pneumatic circuits. In this regard, there may be internal plumbing that is specific to the negative pressure pump 30, and separate internal plumbing specific to the positive pressure pump 31.

Operation of the pump(s) 30, 31 may be controlled by software or algorithms that cause the pump(s) 30, 31 to generate pressures according to a desired testing profile. In this regard, the pumps 30, 31 may be capable of applying variable pressure over the course of a given test, wherein the varying of the pressure may be in accordance with the algorithm or other executable instructions that may be stored on the memory circuit 42 or received from a remote controlling source via the communications circuit 52. Any algorithms or other programming local to the leak detector 10 may be routinely updated via the communications circuit 52 and/or via the USB ports 46 (e.g., data transfer ports).

As noted above, the leak detector 10 may include one or more pressure transducers 38, 40 for measuring pressure applied to the battery case 12 or pressure within the battery case 12 during the course of the test. Each of the pressure transducers 38, 40 may perform their own operational function, depending on the type of test being conducted by the leak detector 10. Along these lines, the leak detector 10 may be capable of performing a battery case leak detection test, to a battery cooling system under-pressure leak detection test, or a battery cooling system over-pressure leak detection test. Each test may be associated with the application of different pressures over different periods of time. Although the tests may be different in some respects, each of the tests may include the same, general phased step(s), which may include: 1) start of pressurization, 2) start of stabilization, and 3) start of evaluation.

The pressure transducers 38, 40 may be in fluid communication with a fluid passageway along which the testing pressure has been applied. For instance, the pressure transducers 38, 40 may be located between the pump 30, 31 and the system under test. The pressure transducers 38, 40 may be capable of measuring a pressure and converting the measured pressure to an electrical signal, which then may be communicated to the processor 54. The processor 54 may input the measured pressures into testing algorithms or programs when conducting the tests. It is also contemplated that the processor 54 may compare the detected pressures to one or more baseline pressures to determine whether leak decay is occurring. In one particular embodiment, a negative pressure transducer 38 may be capable of detecting pressures having a magnitude in the range of 0.0-1.01325 bar. A low positive pressure transducer 40 may be configured to detect a signal in the range of 0-4.05300 bar absolute reference. Furthermore, the pressure transducers 38, 40 may be capable of measuring a pressure signal that is of a magnitude of 0.00001 Bar.

The transducers 38, 40 may be sampled at a rate that is specific to each step of the process. The control of the sampling rates of the transducers 38, 40 may be based on preprogrammed instructions and may be implemented via command signals received at the transducers 38, 40 from the processor 54. For instance, in one particular embodiment, the transducer(s) 38, 40 may be sample at a 10 Hz rate during the start of pressurization and the start of stabilization steps and sampled at a 50 Hz rate during the start of evaluation step of the test process. Of course, other sampling frequencies may be employed without departing from the spirit and scope of the present disclosure.

According to one particular implementation, the leak detector 10 may be capable of measuring pressure data with defined accuracy down to five places to the right of the decimal point (e.g., x.xxxxx), as may be necessary to meet pass/fail criteria that may be set by a vehicle manufacturer. To achieve this level of measurement, the leak detector 10 may utilize an analog to digital converter (A2D) that supports high resolution. A 16-bit A2D shall accept the analog signal from the transducers 38, 40 and turn the analog signal(s) into a digital stream via inter-integrated circuit (I2C) protocol.

According to one embodiment, the leak detector 10 may be configured to operate in a first, pre-testing mode before proceeding to a second, main testing mode. The pre-test may be conducted by operating one of the pumps 30, 31 and applying a first pressure (positive or negative) to the volume of the battery case 12 to determine whether the applied pressure results in a change in pressure in the volume of the battery case 12. If a change in pressure is detected, the leak detector 10 may be configured to proceed with a main test by operating one of the pumps 30, 31 to apply a second pressure (positive or negative) associated with a desired testing procedure. The pre-test may allow for a quick and easy determination of a large leak, as the size of the leak may not allow for any appreciable pressurization of the battery case 12. If the pre-test reveals a leak is present, the main test can be avoided. The transition between the first, pre-testing mode to the second, main testing mode may proceed autonomously if certain conditions (e.g., pressure(s)) are detected during the pre-test. Alternatively, the leak detector 10 may be configured to require user confirmation/input that the pre-test data is sufficient to proceed with the main test. The confirmation/input may be entered via the user interface 32 or via a smartphone or other electronic device that may be paired or operatively linked to the leak detector 10.

The display/user interface 32 may be included on the housing 28 to provide user control of the leak detector 10, as well as to facilitate display of data or results associated with the tests. The display/user interface 32 may be integrated into a single touch-screen, or alternatively, into a display screen, and a separate user control mechanism (e.g., switch(es), button(s), knob(s), etc.). The user interface 32 may include a manual start/stop test switch, that when actuated, may initiate a new leak detection test, and when deactivated, may cease a test that is underway, wherein the test may continue to cycle through the test until it reaches a predetermined stopping point. The user interface 32 may also provide a means for shutting down a test in progress at any point in the test, such as an immediate shutdown or panic exit.

Although the leak detector 10 may include an integrated display, it is also contemplated that the leak detector 10 may be configured to be connectable to an external display. In one embodiment, the external display may be connected to a USB type A connector with 2.0 speed. The use of an external display may be particularly useful at training events, wherein display of operational data, tests, information, etc., may be preferred for a larger audience.

The leak detector 10 may include a plurality of light emitting diodes (LEDs) 34 that may be configured to be selectively illuminated to indicate a specific operational mode of the leak detector 10. The LEDs 34 may be externally located on the housing 28 and may be positioned to provide a quick visual indicator of the operational status of the leak detector 10 to the user. The LEDs 34 may be in operative communication with the processor 54 to receive operational instructions or command signals therefrom. In the exemplary embodiment, four LEDs 34 are included, with each LED 34 being associated with a different color. One color (e.g., blue) may be illuminated to indicate the leak detector 10 is in a ready state. Another color (e.g., orange), may be illuminated to indicate the leak detector 10 is currently performing a test. Yet another color (e.g., green) may be illuminated once a test has been completed and the battery case under test has passed the test. A final color (e.g., red) may be illuminated once a test has been completed and the battery case under test has failed the test. If no LED 34 is illuminated, it may be indicative of the leak detector 10 being in an off state.

In addition to the visual alerts that may be provided by the LEDs 34, it is contemplated that the audible alert circuit 36 (e.g., a beeper) may provide audible alerts associated with operation of the leak detector 10. In this regard, the audible alert circuit 36 may be in communication with the processor 54 to receive status signals therefrom, and the audible alert circuit 36 may emit audible signals which correspond to the received status signals. For instance, during the course of testing a battery case 12, the audible alert circuit 36 may output a signal of different tone duration and/or frequency for each of several different device status conditions (e.g., test underway, test failed, test passed). The ability to generate an audible alert signal may allow a user to perform other tasks while the leak detector 10 is conducting a test. In one particular embodiment, the audible tone is approximately 2400 Hz resonant frequency with 85 dBA/10 cm sound pressure minimum, although other sound characteristics may be employed without departing from the spirit and scope of the present disclosure.

The memory circuit 42 may be in communication with the processor 54 and may store computer executable instructions, software, algorithms, programs, or the like, which may be executed or implemented during operation of the leak detector 10. In addition, testing data, vehicle data and information, customer data, etc., may also be stored by the memory circuit 42, either on a long-term basis (e.g., over the course of multiple tests), or a short-term basis (over the course of one test or only a handful of tests). In this regard, the memory circuit 42 may be accessible by the processor 54 to retrieve stored instructions, data, information, or the like, as may be needed to facilitate operation of the leak detector 10. Although the exemplary embodiment shows the memory circuit 42 as being located in the housing 28, it is contemplated that remote memory resources, such as cloud-based storage, or remote data servers, may also be accessed and used by the leak detector 10.

The solenoid valves 44 may be included in the leak detector 10 as lockout valves to seal pneumatic plumbing segments (e.g., negative pressure segment, low positive pressure segment) as may be desired. For instance, the solenoid valves 44 may in fluid communication with a pneumatic plumbing segment located between the pump 30, 31 and the system under test to lockout the pump 30, 31 from the pressurized segment. In this regard, when the solenoid valve 44 is closed, fluid components or segments on opposite sides of the solenoid valve 44 may be fluidly isolated from each other. The solenoid valves 44 may receive instructions/commands for operation (e.g., transitioning between closed and open positions) from the processor 54. In one particular implementation, the solenoid valve 44 may be open during operation of the pump 30, 31 to allow the pump 30, 31 to apply a prescribed pressure to a pneumatic plumbing segment connected to the system under test. After the pressure has been generated and applied by the pump 30, 31, the solenoid valve 44 may be closed, and the pump 30, 31 may be turned off. Thus, when the solenoid valve 44 is closed, the pump 30, 31 may be isolated or locked-out from the pressurized pneumatic plumbing segment.

Figure 3:
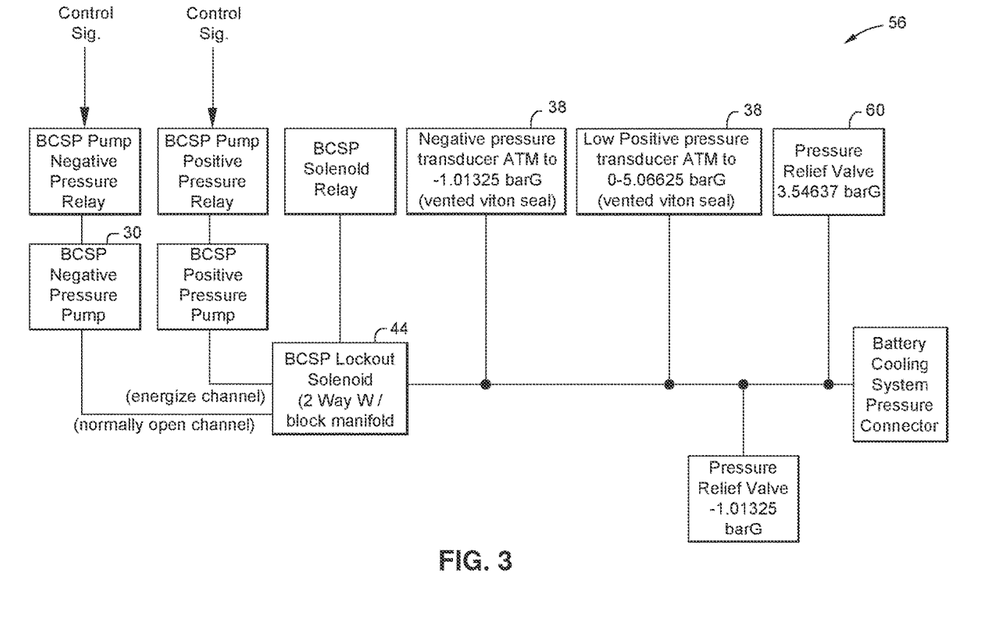
FIG. 3 is a schematic view of an electro-pneumatic circuit of the leak detector for use in conducting a negative pressure leak detection test.
Figure 4:
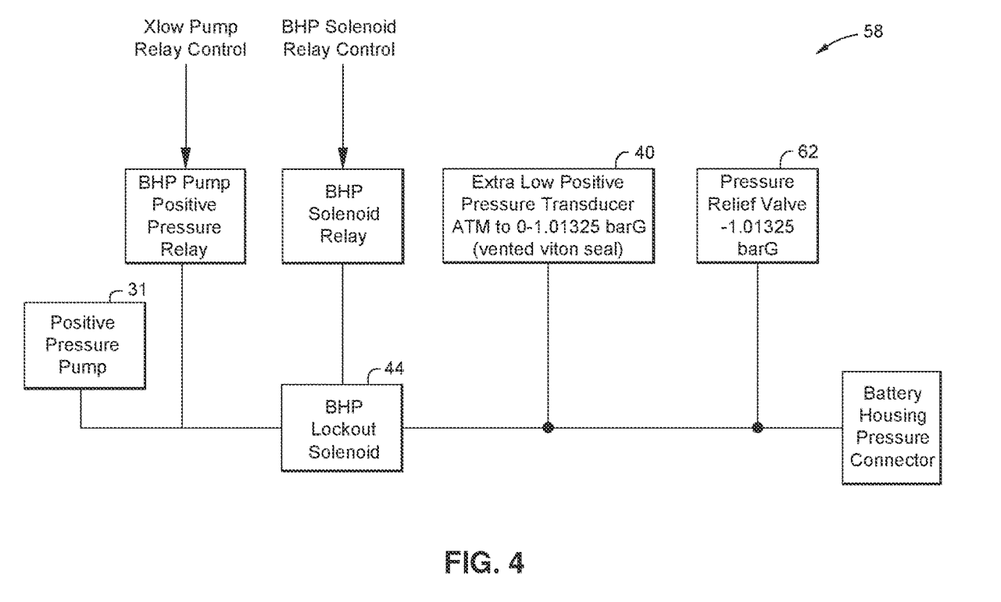
FIG. 4 is a schematic view of an electro-pneumatic circuit of a leak detector for use in conducting a positive pressure leak detection test.

The leak detector 10 may include one or more pneumatic circuits included therein, such as a negative pneumatic circuit 56 (see FIG. 3) and a positive pneumatic circuit 58 (see FIG. 4). Each pneumatic circuit 56, 58, as well as the various pneumatic control components (e.g., pump, valves, transducer, tubing, etc.) as may be needed to generate, deliver, and monitor the desired pressure within the pneumatic circuit.

The leak detector 10 may include one or more pressure relief valves configured to open a respective pneumatic circuit 56, 58 and vent to ambient air when a prescribed pressure relief magnitude is achieved within the given pneumatic circuit 56, 58. For a battery cooling system pressure test, a separate pressure relief valve may be utilized on each of the negative pressure and positive pressure pneumatic circuits 56, 58. For the battery housing pressure test, a separate pressure relief valve may be utilized on an extra low positive pressure pneumatic circuit. The pressure relief valve may provide safeguards to the leak detector 10 against injection of pressures that may cause damage to the internal components of the vehicle system under test or the to the leak detector 10 itself.

Referring now specifically to FIG. 3, there is depicted a pair of internal negative pressure relief valves 60, which may be connected to the test circuit side of the lockout solenoid 44 for the negative pressure pneumatic circuit 56. One or more of the negative pressure relief valves 60 may open to ambient air when the test circuit reaches 0.00 barA, which may represent a 10.5% margin of safety given a −0.90 barG (−13.0 PSIG) working pressure and a −1.01 barG (−14.695 PSIG) relief pressure. If applied negative pressure rises above the relief valve pressure, the negative pressure relief valve may be capable of a self-reset function. The pressure relief valve(s) 60 may open at a value less than a specified transducer over-pressure specification.

One of the pressure relief valves 60 may be an extra low positive pressure relief valve configured to open to ambient air when the test circuit reaches 2.0 barA, which may represent a 28% margin of safety given a 1.5 barG (22.0 PSIG) working pressure and a 2.0 barG (29.3 PSIG) relief pressure. If applied extra low positive pressure falls below relief valve pressure, the extra low pressure relief valve 60 may be capable of a self-reset function. The pressure relief valve 60 may open at a value less than the specified transducer over-pressure specification.

Referring now specifically to FIG. 4, an example of the positive pneumatic circuit 58 is depicted, which includes a positive pressure relief valve 62 (e.g., low positive pressure relief valve) may be connected to the test circuit side of the lockout solenoid 44 for the low positive pressure pneumatic circuit 58. The low positive pressure relief valve 62 may open to ambient air when the test circuit reaches 4.5 barA, which may represent a 33% margin of safety given a 2.5 barG (36.2 PSIG) working pressure and a 3.5 barG (51.4 PSIG) relief pressure. If applied low positive pressure falls below relief valve pressure, the low-pressure relief valve 62 may be capable of a self-reset function. The pressure relief valve 62 may open at a value less than the specified transducer over-pressure specification.

Figure 5:
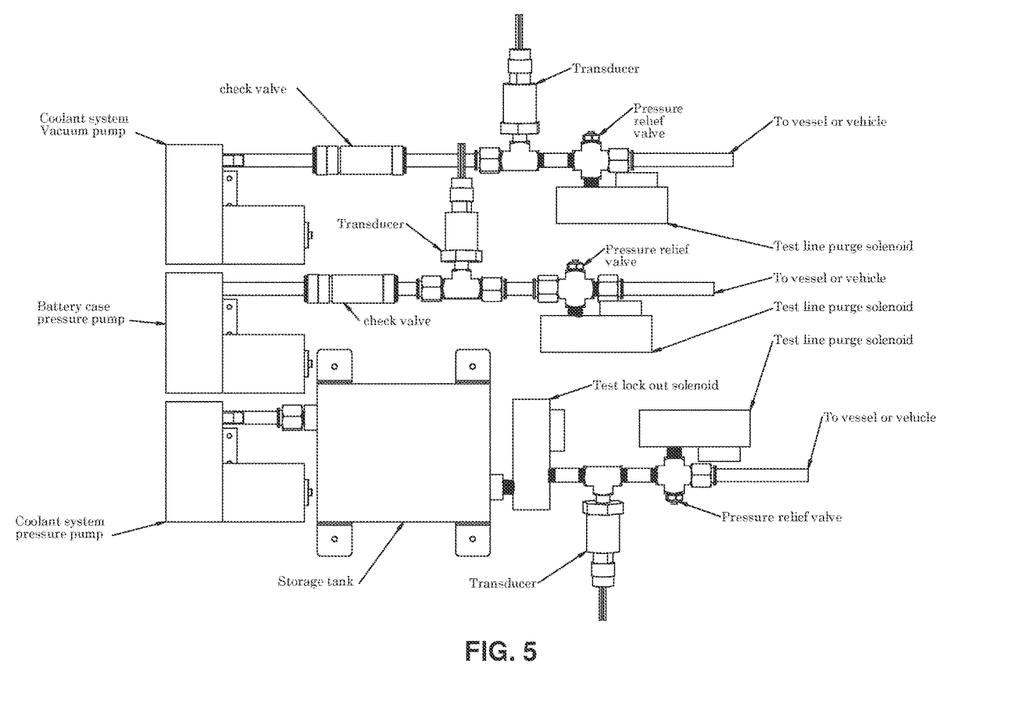
FIG. 5 is a schematic view of a pneumatic assembly included in one embodiment of the leak detector.
Figure 6:
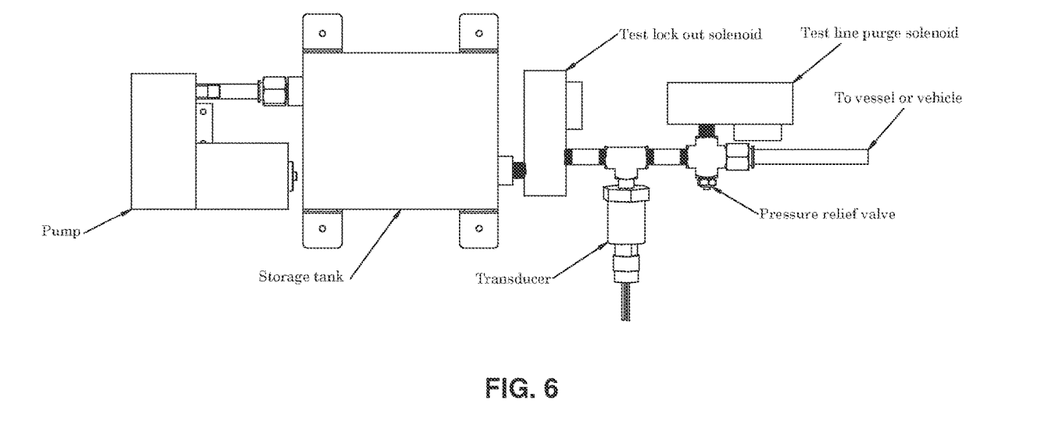
FIG. 6 is a schematic view of a single pneumatic circuit included in one embodiment of the leak detector.

FIG. 5 is a schematic view of one embodiment of a pneumatic assembly that may be included in the leak detector 10. As can be seen, the pneumatic assembly includes three pumps, each being associated with its own pneumatic circuit. In particular, a first pump may be a vacuum pump configured for testing a coolant system. The first pump may be in communication with a first check valve, a first transducer, a first pressure relief valve, and a first test line purge solenoid, which may collectively define a first fluid circuit. The pneumatic assembly may additionally include a second pressure pump configured for testing a battery case. The second pump may be in communication with a second check valve, a second transducer, a second pressure relief valve, and a second test line purge solenoid, which may collectively define a second fluid circuit. The pneumatic assembly may further include a third pressure pump configured for testing a coolant system. The third pump may be in communication with a storage tank, a test lock out solenoid, a third transducer, a third pressure relief valve, and a third test line purge solenoid, which may collectively define a third fluid circuit. FIG. 6 is a schematic view of the third circuit by itself. Each fluid circuit may be fluidly independent of the others. Furthermore, the leak detection device 10 may include any number of fluid circuits therein.

When performing precise leak testing on battery enclosures, or other environments, such as cooling systems, motor housings, inverters or any other systems, vehicular and otherwise, that may require a sealed environment, it may be imperative that the leak detector 10 is configured to be calibrated prior to each test that is performed. According to one embodiment, calibration of the leak detector 10 may include taking readings from the transducers. In more detail, prior to any test being performed, the transducers may take an atmospheric pressure reading (e.g., the first transducer may take a first calibration pressure reading, the second transducer may take a second calibration pressure reading, and the third transducer may take a third calibration pressure reading). The calibration pressure readings between all of the transducers may be compared (e.g., triangulation). If any transducer fails to capture the same readings as other transducers (or a similar reading within a prescribed margin of error), the leak detector 10 may be configured to prevent testing if the calibration reveals one or more of the pressure transducers provides an error reading. As such, the calibration process may ensure that any testing that is performed produces reliable, accurate testing data. Along those lines, the leak detector 10 may provide a data log for any test performed and includes verification that the calibration function was completed and passed.

The power supply 48 may include an electrical plug that is connectable to an external power source, such as a power outlet on a wall. An On/Off power switch may be externally mounted on the housing 28 to allow for selective control of power flow to the components of the leak detector 10. When the power switch is in an On position, the external power may flow to all applicable components on the leak detector 10. Conversely, when the power switch is in an Off position, the power signal is stopped from flowing to the components.

The leak detector 10 may additionally include a power management circuit 50 configured to protect the electronic components on the leak detector 10 from over-current and over-voltage conditions. According to one embodiment, the over-current protection provided by the power management circuit 50 may protect and safeguard electronics on the device from a 1-amp sink current value. Furthermore, the over-voltage protection provided by the power management circuit may protect and safeguard electronics on the device from a 140 VAC voltage surge.

The communications circuit 52 may be in operative communication with the processor 54 to facilitate communication of data or other electrical signals between remote devices and the leak detector 10. The communications circuit 52 may be capable of facilitating communications via Ethernet, WiFi, Bluetooth, cellular communication, or via other communication modalities known in the art. In this regard, a user's smartphone or tablet computer may be paired, linked or otherwise operatively connected to the leak detector 10 via the communications circuit 52.

One or more USB ports 46 or similar electrical ports (e.g., micro-USB, etc.) may be included on the leak detector 10 to facilitate power communication and/or data communication between an external electronic device and the leak detector 10. The USB ports 46 may support USB 2.0 industry standard.

In order to facilitate fluid interconnection between the leak detector 10, and the battery case 12, or other device under test, the leak detector 10 may include a hose 64 that is attachable to the housing 28 via a quick-disconnect fitting. In this regard, a male-type quick-disconnect style plug 66 may be coupled to the housing 28 which is adapted to engage with a corresponding female-type quick-disconnect style fitting 68 on the hose 64. The body of the hose 64 may be an anti-collapsible hose to provide sufficient internal strength to withstand the pressures that may be exerted during use. In one particular embodiment, the anti-collapsible hose may not collapse when a −2.0 PSI vacuum signal is applied to the hose.

Figure 7:
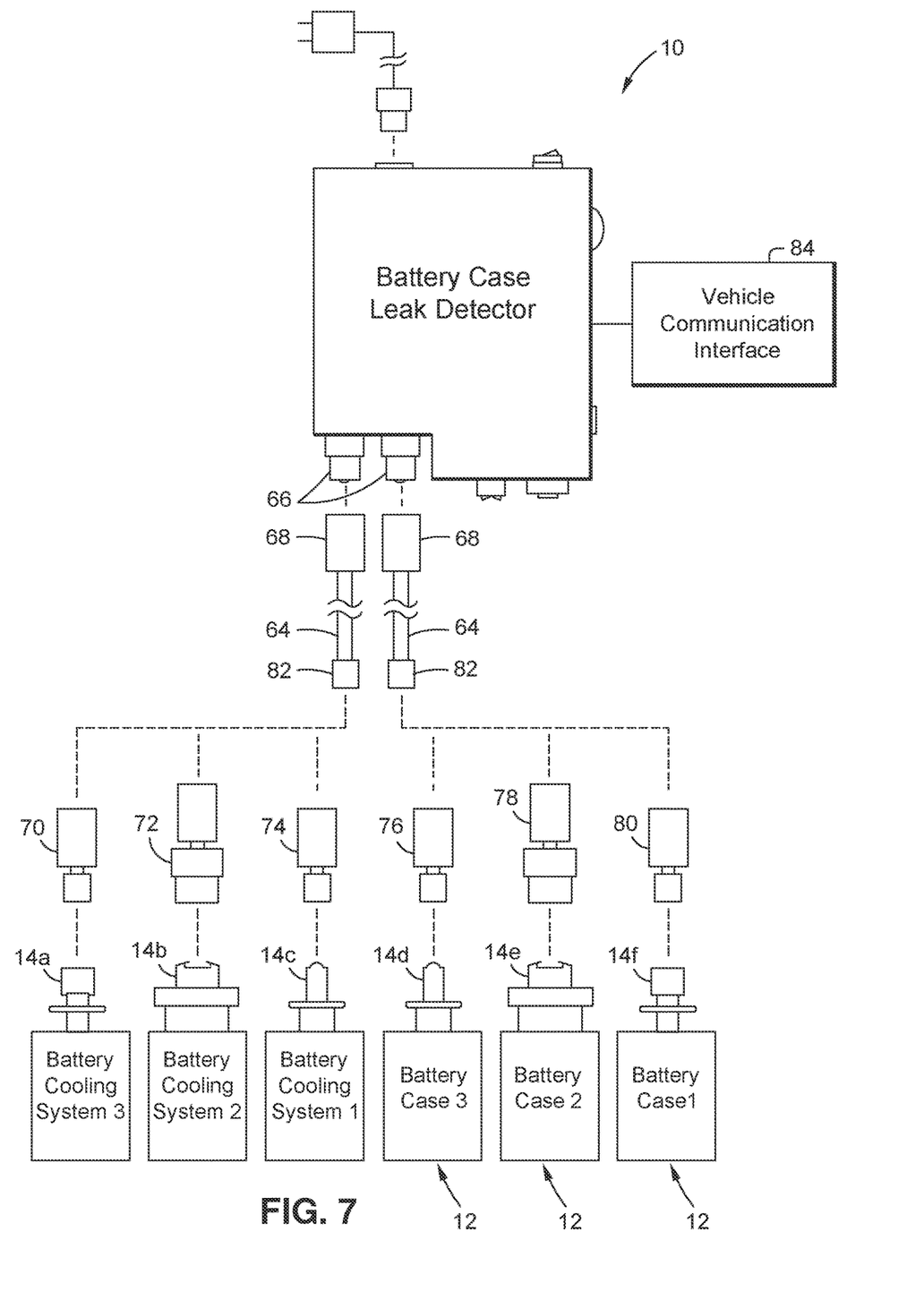
FIG. 7 is a schematic view depicting connectability of the leak detector with several differently configured service ports.

As noted above, a service port adapter may be utilized to facilitate sealed, fluid communication/connection between the hose and the service port on the battery case. The specific configuration/external contours of the service port adapter may be complementary to the configuration/external contours of the service port to facilitate the fluid connection. FIG. 7 shows several different service port adapters 70-80 configured to enable interface between the hose 64 and the ports 66 on the housing 28. One end portion of the service port adapters 70-80 may be similar or universal to connect to an end fitting 82 on the hose 64, while the other end portion of the service port adapters 70-80 may be complementary in configuration to the service ports 14*a-f*.

The leak detector 10 may include a vehicle communications interface 84 configured to allow for acquisition of operating parameter data from vehicle mounted electronic control modules. For instance, the vehicle communications interface 84 may allow for receipt of a vehicle identification number, odometer reading, and battery module operation. The vehicle communications interface 84 may also support applicable serial communication protocols (e.g., CAN). It is contemplated that the vehicle communications interface 84 may be integrated into the leak detector 10 or may be a separate module connectable to the vehicle data link connector and capable of wireless communication with the main portion of the leak detector 10. In this regard, the vehicle communications interface 84 may be in operative communication with the processor 54, either via direct, wired communication, or via wireless communication.

The vehicle communications interface 84 may be used to retrieve the vehicle identification number (VIN) from the vehicle. However, the VIN may be retrieved from multiple sources on the vehicle, including owner documentation, digital coding visible on the vehicle, or electronic control unit memory. The VIN may be decoded to vehicle manufacturer, year, make, and model, from which the applicable battery case adapter and battery case test volume can be looked up. Thus, by retrieving or otherwise receiving the VIN, the particular service port adapter 70-80 needed to interface with the particular battery case 12 on the vehicle under test may be determined. In this regard, the memory circuit 42 may include a lookup table having different battery cases 12 and the respective service ports 14 matched with VIN information, and service port adaptors 70-80, such that by knowing the VIN, the lookup table may be referenced to determine the associated service port 14, which can also be used to determine the service port adaptor 70-80.

Upon completing a test, the leak detector 10 may be configured to generate a post-test report, which may include, but is not limited to, the date and time of the test, the name of the shop that completed the test, a repair order number, vehicle information (e.g., VIN, year, make, model), battery case information (e.g., volume), adapter used during test, result of test (e.g., pass, fail, incomplete).

Figure 8:
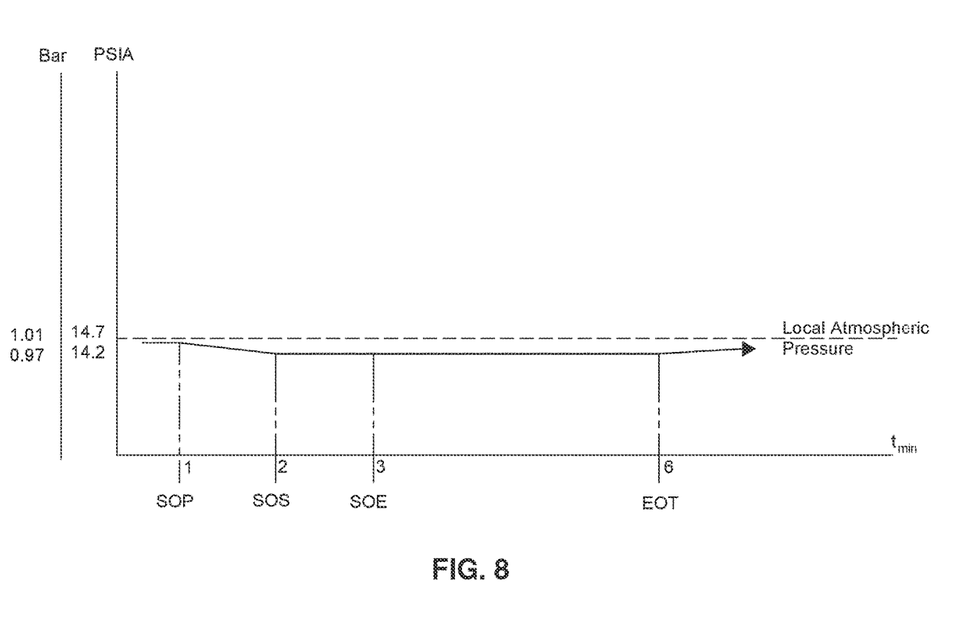
FIG. 8 is a reference plot of low vacuum applied to a battery case with time and pressure axes.
Figure 9:
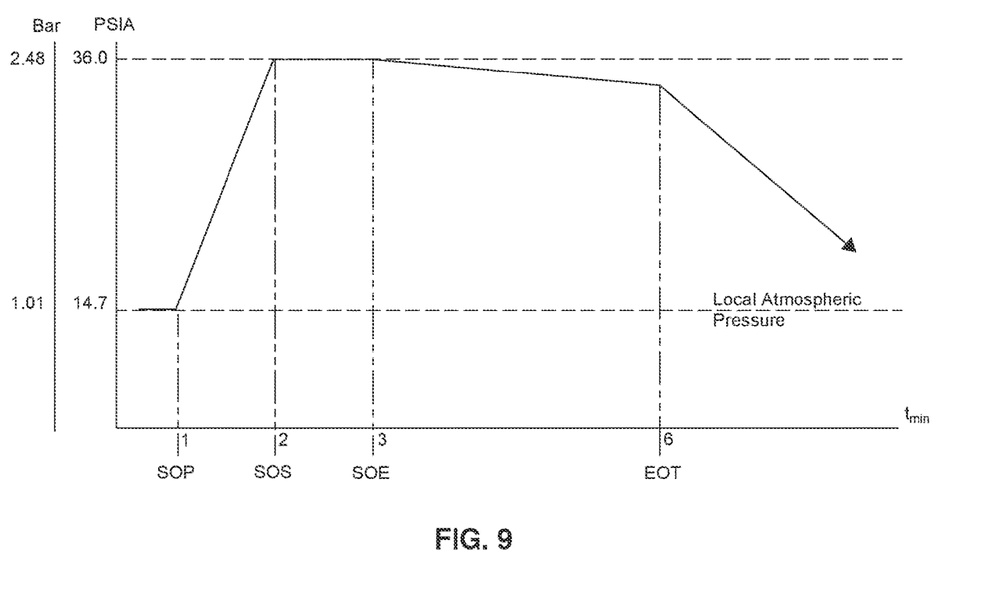
FIG. 9 is a reference plot of low pressure applied to a battery cooling system with time and pressure axes.

As noted above, during a given test, the leak detector 10 may monitor pressure over a given duration of time. The detected pressure over time may be compiled and presented in graphical form on the display 32. FIG. 8 is an example of a graph showing pressure over a period of time during a negative pressure test, while FIG. 9 is an example of a graph showing pressure over a period of time during a positive pressure test. Each graph lists the start of pressurization (SOP), start of stabilization (SOS), start of evaluation (SOE) and end of test (EOT).

Figure 10:
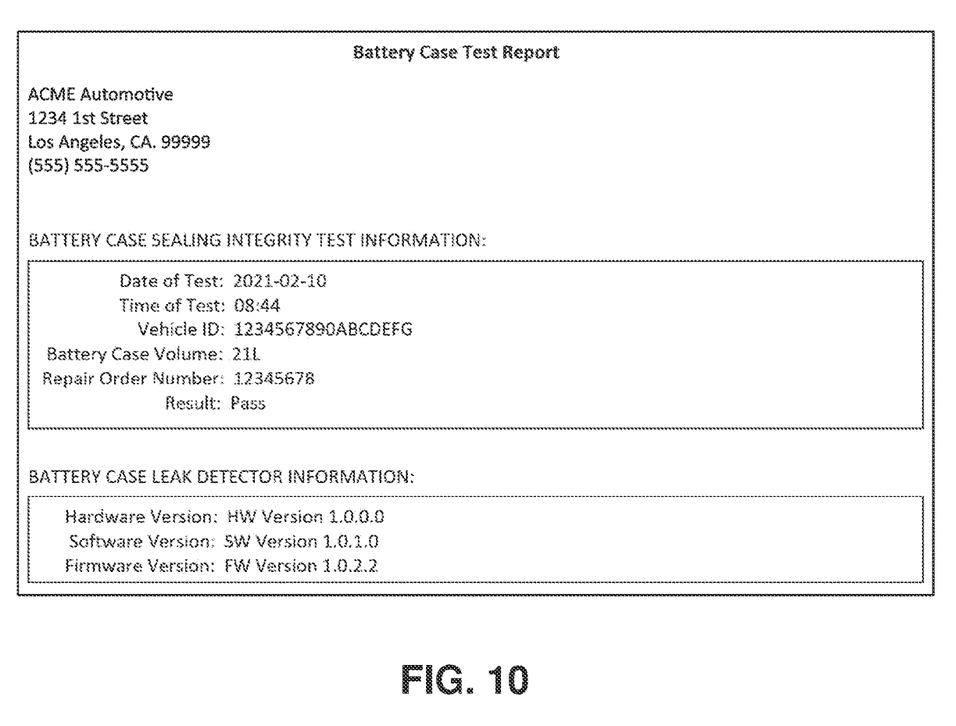
FIG. 10 is an exemplary depicting of a test report for a battery case leak test.

FIG. 10 is an example of a test report that may be generated following a test. As can be seen, the test report may include the name of the facility that performed the test, the type of test conducted, the date and time of the test, the VIN, the battery case volume, repair order number, and the result.

According to one embodiment, the leak detector 10 may be configured to perform a test within 25 seconds of power-up. However, certain tests may take longer than 25 seconds of power-up to perform, and thus, the present disclosure is not limited thereto.

The leak detector 10 and related method of use may allow for confirmation of battery case integrity through the use of a guided, structured and repeatable leak detection test that may report accurate results following examination. The results of the testing performed by the leak detector 10 may be useful for several different entities. For instance, a car dealership 22 performing the test may want to track the tests to try and identify possible diagnostic trends associated with the battery cases. For instance, if a certain model of battery case is identified as being particularly susceptible to leaks, the dealership 22 may reach out to its customers to alert them to the possible issues and advise the customers to visit the dealership for testing. This may be desirable to the customer to ensure their vehicle is operating as safely and efficiently as possible. It may also be desirable for the dealership to generate goodwill with its customers, and also as a means to promote repeat patronage of the dealership.

It is also contemplated that government agencies 24 may desire to know the results of the leak testing. In this regard, possible regulations may be associated with unacceptable leak levels, similar to smog testing on conventional combustion engine vehicles. Thus, the leak detector 10 may provide and easy and streamlined process of conducting the tests and uploading the information to the relevant government agencies 24.

Insurance companies 26 may also for the results of a leak detection test useful, as the presence of a leak may be an early indicator of possible issues with the vehicle. Conversely, the absence of a detected leak may be indicative of good vehicle health. As such, the insurance company 26 may use the results of the leak detection test for purposes of adjusting insurance rates and premiums. In particular, when one or more leaks is detected on a vehicle, the insurance company may use that information to raise the insured's premium, and the absence of a leak, or the presence of an acceptable number of leaks, may results in the lowering of the insured's premium.

Although the foregoing describes the leak detector 10 as including one or more internal or integrated pumps for generating the pressure needed for the leak detection testing, it is contemplated that certain embodiments of the leak detector 10 may be configured to facilitate fluid attachment to an external pressure source (either a positive pressure source or a negative pressure source) for generating the pressure needed for the leak detection testing. For instance, should high pressure testing be required (e.g., over 50 PSIG), it may be possible to connect the leak detector 10 to a compressed air source, such as shop air that may be available in a service bay.

In addition to applying pressure for purposes of conducting leak detection, it is also contemplated that one or more of the pumps 30, 31 included in the leak detection may be used to generate a desired pressure for purging fluid from a system prior to testing that system.

Along these lines, electric vehicle battery technology typically utilizes chemical cells whose composition create energy. A common byproduct of this energy creation is heat, which may require controlling within a desired temperature range. Keeping battery cells at a defined operating temperature range may allow for proper battery cell health and maintenance. Additionally, when operating within the ideal temperature range, the battery itself may allow for almost perfect energy extraction by consuming components.

A cooling system may be used as the means to surround the battery cells with an ideal temperature range. Typically included in a conventional battery cooling system is a pump, hose, heat exchanger, liquid coolant, and other components, and thus, the cooling system may present several failure points. As such, one test of the battery case cooling system may include check line and hose integrity by applying pressure to the system.

Before such a test is performed, liquid coolant must be drained from the cooling system circuit(s). A common method to accomplish this to open the cooling system and allow for a gravity drain of liquid coolant. However, due to cooling system circuit routing inside the battery case typically being a wonderous array of tube and fin design, it can be possible for pockets of liquid coolant to remain in the battery case.

Accordingly, the leak detector 10 may be associated with a clear coolant function which may clear most, if not effectively all, remaining coolant out of small compartments in the tube and fin structure. Bursts of positive pressure occurring at timed intervals may be scheduled throughout the function. These pulses may create a laminar air wave which may be used to push or urge puddled liquid coolant out of the small orifices and crevices that are found in the tube and fin compartments.

The pressure wave may be comprised of a "test" air volume, which may be increased through the use of a storage tank that accumulates and stores a volume of air. The volume of air, which may be prepared at a test pressure, may be released into the battery cooling system circuit. The volume of air stored in the storage tank may lead to system under test reduced fill time when performing diagnostic test(s). When entering the system under test, the boosted air wave may clear the battery cooling system circuit of coolant.

The process of submitting the boosted air wave into the battery cooling system circuit may be repeated over a scheduled time duration or intervals. Clearing the battery case cooling system of coolant may allow for more accurate results from diagnostic test(s) on liquid cooling system sealing integrity.

It is understood that any dimension, magnitude, flow rate, or other value provided herein is merely for purposes of example and not for purposes of limiting the scope of the present disclosure. Furthermore, for any value provided herein, any industry acceptable tolerance may be used without departing from the spirit and scope of the present disclosure. Although the foregoing describes the leak detector 10 as being useful for detecting the presence of leaks in an electric vehicle battery enclosure, it is contemplated that the use of the leak detector 10 is not limited thereto. In this regard, various iterations of the leak detector 10 may be used to detect leaks on almost any sealed environment, including other components on a vehicle, as well as use in testing for leaks in other appliances (e.g., home appliances), or other sealed environments. In this regard, different adaptors may be used to facilitate interfacing between the leak detector 10 and the unit under test, and modifications to the algorithms or computer software may be implemented to conform the testing to the specific environment under test.

The particulars shown herein are by way of example only for purposes of illustrative discussion, and are not presented in the cause of providing what is believed to be most useful and readily understood description of the principles and conceptual aspects of the various embodiments of the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A battery case leak testing device comprising:
   a housing having a testing port;
   a pump in fluid communication with the testing port, the pump being configured to generate a prescribed pressure at the testing port;
   a pressure sensor in fluid communication with the testing port to measure fluid pressure at the testing port; and
   a controller coupled to the housing and in operative communication with the pump and the pressure sensor, the controller being configured to facilitate operation of the pump in a first mode and a second mode, in the first mode, the pump operates to generate a first prescribed pressure at the testing port, in the second mode, the pump operates to generate a second prescribed pressure at the testing port, the controller transitioning the pump from the first mode to the second mode when the pressure sensor measures a prescribed pressure characteristic when the pump is operating in the first mode;
   wherein the device is fluidly connectable to a battery case such that the battery case is external to the device.

2. The device recited in claim 1, wherein when in the second mode, the pressure sensor is configured to measure pressure at the testing port over a prescribed period of time, and the controller is configured to generate a pass signal when the measured pressure conforms to a prescribed pressure profile.

3. The device recited in claim 2, wherein the device further comprises a processor, and the prescribed pressure profile being vehicle specific and is determinable by the processor based on vehicle information associated with the vehicle under test.

4. The device recited in claim 1, further comprising a hose fluidly connectable to the testing port.

5. The device recited in claim 4, further comprising an adapter coupled to the hose and configured to be connectable to the testing port.

6. The device recited in claim 1, further comprising:
   a fluid pathway between the pump and the testing port; and
   a valve in fluid communication with the fluid pathway and capable of transitioning between an open position and a closed position, in the closed position, the valve prevents fluid communication between the pump and the valve.

7. The device recited in claim 1, wherein the pump is configured to generate a negative pressure at the testing port.

8. The device recited in claim 1, wherein the pump is configured to generate a positive pressure at the testing port.

9. A battery case leak testing device comprising:
   a housing having a positive pressure testing port and a negative pressure testing port;
   a negative pressure pump in fluid communication with the negative pressure testing port, the negative pressure pump being configured to generate a prescribed negative pressure at the negative pressure testing port;
   a positive pressure pump in fluid communication with the positive pressure testing port, the positive pressure pump being configured to generate a prescribed positive pressure at the positive pressure testing port;
   a negative pressure sensor in fluid communication with the negative pressure testing port to measure fluid pressure at the negative pressure testing port; and
   a positive pressure sensor in fluid communication with the positive pressure testing port to measure fluid pressure at the positive pressure testing port;
   a controller coupled to the housing and in operative communication with the negative pressure pump, the positive pressure pump, the negative pressure sensor and the positive pressure sensor, the controller being configured to facilitate operation of the device in a negative test mode and a positive test mode, in the negative test mode, the negative pressure pump is actuated to generate a prescribed negative pressure at the negative pressure testing port, in the positive test mode, the positive pressure pump is actuated to generate a prescribed positive pressure at the positive pressure testing port, the controller being configured to determine operation in one of the negative test mode and the positive test mode based on information received associated with a battery case under test.

10. The device recited in claim 9, wherein when in the negative test mode, the negative pressure sensor is configured to measure pressure at the negative testing port over a prescribed period of time, and the controller is configured to generate a pass signal when the measured pressure conforms to a prescribed pressure profile.

11. The device recited in claim 10, wherein the device further comprises a processor, the prescribed pressure profile being vehicle specific and is determinable by the processor based on vehicle information associated with the vehicle under test.

12. The device recited in claim 9, wherein when in the positive test mode, the positive pressure sensor is configured to measure pressure at the positive testing port over a prescribed period of time, and the controller is configured to generate a pass signal when the measured pressure conforms to a prescribed pressure profile.

13. The device recited in claim 9, further comprising a hose fluidly connectable to one of the negative testing portion and the positive testing port the testing port.

14. The device recited in claim 13, further comprising an adapter coupled to the hose and configured to be connectable to the service port.

* * * * *